(12) United States Patent
Schroeder et al.

(10) Patent No.: US 9,655,245 B2
(45) Date of Patent: May 16, 2017

(54) SURFACE MOUNTED STANDOFF LIGHT EMITTING DIODE DEVICE

(71) Applicant: Visual Communications Company, LLC, Poway, CA (US)

(72) Inventors: Christopher Karl Schroeder, San Diego, CA (US); Mark Warner Baker, San Diego, CA (US)

(73) Assignee: VISUAL COMMUNICATIONS COMPANY, Poway, CA (US)

( * ) Notice: Subject to any disclaimer, the term of this patent is extended or adjusted under 35 U.S.C. 154(b) by 272 days.

(21) Appl. No.: 14/701,277

(22) Filed: Apr. 30, 2015

(65) Prior Publication Data

US 2016/0238200 A1    Aug. 18, 2016

Related U.S. Application Data

(60) Provisional application No. 62/117,861, filed on Feb. 18, 2015.

(51) Int. Cl.
| | |
|---|---|
| *F21V 19/00* | (2006.01) |
| *F21V 21/00* | (2006.01) |
| *H05K 1/18* | (2006.01) |
| *H05K 3/30* | (2006.01) |
| *F21K 9/90* | (2016.01) |
| *F21K 9/20* | (2016.01) |
| *F21Y 115/10* | (2016.01) |

(52) U.S. Cl.
CPC ............ *H05K 1/181* (2013.01); *H05K 3/301* (2013.01); *F21K 9/20* (2016.08); *F21K 9/90* (2013.01); *F21Y 2115/10* (2016.08); *H05K 2201/10106* (2013.01); *H05K 2201/10962* (2013.01)

(58) Field of Classification Search
USPC ......... 362/249.01, 249.02, 249.11, 294, 382; 257/98–100
See application file for complete search history.

(56) References Cited

U.S. PATENT DOCUMENTS

| | | | | |
|---|---|---|---|---|
| 4,065,198 A * | 12/1977 | Jordan | ...................... | H05K 7/12 439/56 |
| 5,426,265 A * | 6/1995 | Savage, Jr. | ............ | H05K 3/301 174/138 G |
| 5,760,754 A * | 6/1998 | Amero, Jr. | ................. | G09F 9/33 345/102 |
| 8,206,003 B1 * | 6/2012 | LaBarge | .................... | F21L 4/08 206/389 |
| 8,885,257 B2 * | 11/2014 | Ovrutsky | ............... | G03B 17/02 359/621 |
| 2009/0073713 A1 * | 3/2009 | Glovatsky | .............. | H05K 1/141 362/520 |

(Continued)

*Primary Examiner* — Tuyen K Vo
(74) *Attorney, Agent, or Firm* — Perkins Coie LLP

(57) ABSTRACT

This application discloses a standoff device for surface-mounting light emitting diodes (LEDs). In some embodiments, the standoff has asymmetric features to control orientation of a part in tube or reel packaging. The standoff has a broad base to keep the part upright during the reflow process. The standoff has a lifted bottom surface to allow room for solder flowing onto leads. The standoff has lead holes spaced at a standard distance to hold many different LEDs. In addition, the standoff has a variable height designed to allow one mold to make parts of different heights.

17 Claims, 3 Drawing Sheets

(56) References Cited

U.S. PATENT DOCUMENTS

| | | | | |
|---|---|---|---|---|
| 2009/0184646 A1* | 7/2009 | Devaney | ............ | F21L 4/027 315/113 |
| 2010/0187961 A1* | 7/2010 | Scott | ............ | F21V 3/00 313/1 |
| 2012/0099321 A1* | 4/2012 | Scott | ............ | F21S 8/086 362/249.02 |
| 2012/0287630 A1* | 11/2012 | Ou | ............ | F21V 5/007 362/235 |
| 2014/0056001 A1* | 2/2014 | Hsu | ............ | F21V 23/006 362/249.02 |
| 2015/0043212 A1* | 2/2015 | Coffey | ............ | F21V 23/045 362/294 |

\* cited by examiner

SURFACE MOUNTED STANDOFF LIGHT EMITTING DIODE DEVICE

RELATED APPLICATION

The present application claims priority to and benefit from U.S. Provisional Patent Application No. 62/117,861, filed Feb. 18, 2015 and titled "SURFACE MOUNTED STANDOFF LIGHT EMITTING DIODE DEVICE". The entire content of the provisional application is herein expressly incorporated by reference.

TECHNICAL FIELD

The present application is related to standoff devices and, in particular, to standoff devices for surface mounting.

BACKGROUND

Control Panel designers often desire to put a printed circuit board (PCB) inside their product that provides the interface by which humans interact with the product. This interface can utilize a variety of components on the PCB, such as light-emitting diodes (LEDs), buttons, switches, numerical displays, Liquid crystal display (LCD) displays, etc. For a number of reasons, including the height of the various components on the PCB or protection from electrostatic discharge, the PCB will be mounted at some distance behind the panel surface.

To achieve the desired visual appearance of the human interface, the components on the PCB may need to be raised above the surface of the PCB. Standoffs are a means to accurately and repeatably assemble LEDs on the PCB at a particular height. Standoffs are common for through-hole mounting LEDs to a PCB.

BRIEF DESCRIPTION OF THE DRAWINGS

Various embodiments are disclosed in the following detailed description and accompanying drawings.

DETAILED DESCRIPTION

Figure 1:
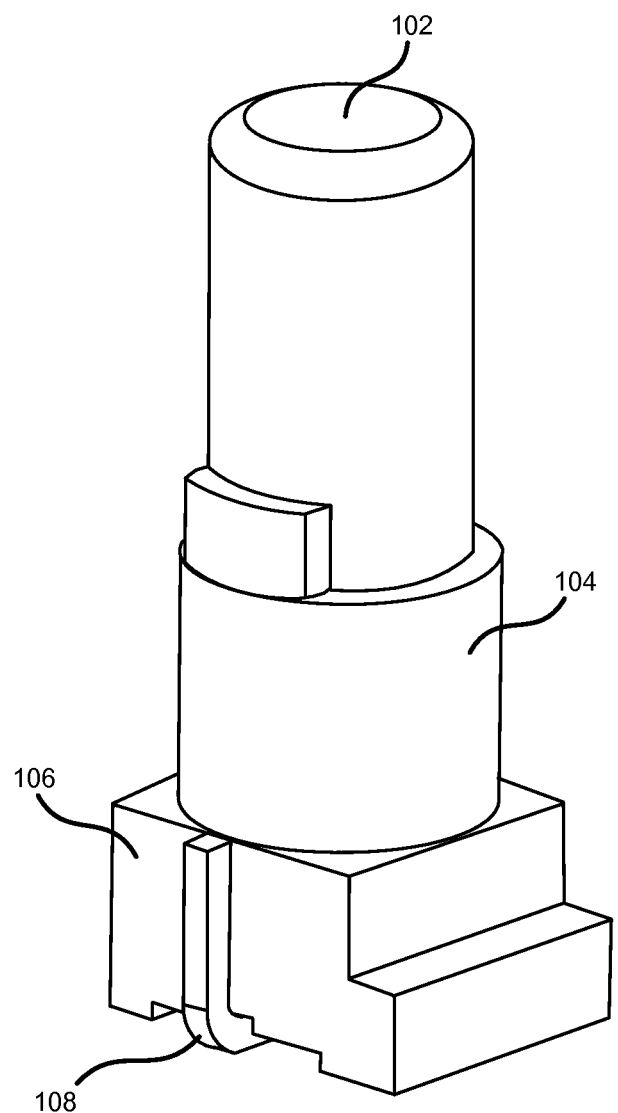
FIG. 1 illustrates a standoff device disclosed in the present application that works with an LED.

This application discloses a standoff device that surface-mounts an LED above a PCB. While designed for control panels and human interfaces, the standoff device may be used anywhere a LED is used—including any device for optical light sources, artistic expression, medical analysis, area illumination, etc.

In some embodiments, a standoff device for surface-mounting light-emitting diodes (LEDs) above a printed circuit board (PCB) is disclosed. The standoff device comprises an integration component that receives one or more LEDs; and a base component that is connected to a bottom of the integration component and in contact with the PCB. The standoff device is made of heat-resistant, moldable material and contains two or more slots for wire frames of the one or more LEDs. The slots run through the integration component and the base component. In addition, the slots associated with the same LED have different shapes or sizes. Moreover, the base component includes a lifted bottom that allows solder flowing onto the wire frames during a reflow soldering process for surface-mounting the LED to the PCB.

In some embodiments, a method for manufacturing a standoff device for surface-mounting light-emitting diodes (LEDs) above a printed circuit board (PCB) is disclosed. The method comprises receiving from a user a specific value; and creating a standoff device comprising an integration component and a base component through a molding process. According to the method, the integration component and the base component stack vertically from top to bottom, and a height of the integration component is based on the specific value. Also according to the method, the standoff device includes multiple slots running vertically through the integration component and the base component to accommodate wire frames of one or more LEDs, and the slots accommodating wire frames of the same LED have different shapes or sizes. Further according to the method, the base component includes a lifted bottom that is large enough to allow solder flowing onto wire frames of the one or more LEDs for surface mounting purposes.

In some embodiments, a method of manufacturing a standoff device for surface-mounting light-emitting diodes (LEDs) above a printed circuit board (PCB) is disclosed. The method comprises receiving a specific value; receiving a specific set of values, each value corresponding to a number of wireframes of an LED to be supported by the standoff device; and setting a height of an integration component of the standoff device based on the specific value. The method comprises setting a number of slots in the standoff device and a shape or size of each slot based on the specific set of value. The method further comprises determining a width of the integration component, a width and a height of a base component of the standoff device, and a shape or size of a solder space to be carved out from the bottom of the base component based on the number of slots and the height of the integration component. Finally, the method comprises molding the standoff device with the integration component on top of the base component according to the set and determined values.

The standoff device disclosed in this application has a number of useful features. The standoff device is capable of completing a successful reflow soldering process with a PCB and one or more LEDs without itself melting, tripping off, or otherwise breaking down. As a result, each LED is surface-mounted to the PCB at a certain altitude above the PCB. The standoff device can be made according to user specifications to suit specific design needs, in terms of the height, the number of LEDs to be supported, etc. Furthermore, the standoff device treats the terminals of each LED asymmetrically to simplify the assembly and packaging processes.

FIG. 1 illustrates a standoff device disclosed in the present application that works with an LED. In some embodiments, the standoff device is made of moldable, heat-resistant material, such as plastic, to ensure the customizability of the standoff device and the survival of the standoff device from a trip through a reflow oven as part of the surface mounting process. The standoff device comprises a base component 106 and an integration component 104. The integration component 104 receives the LED 102 at the top end, and the base component sits between the LED 102 and a PCB. The two components can be made as a single piece from a single mold.

Figure 2:
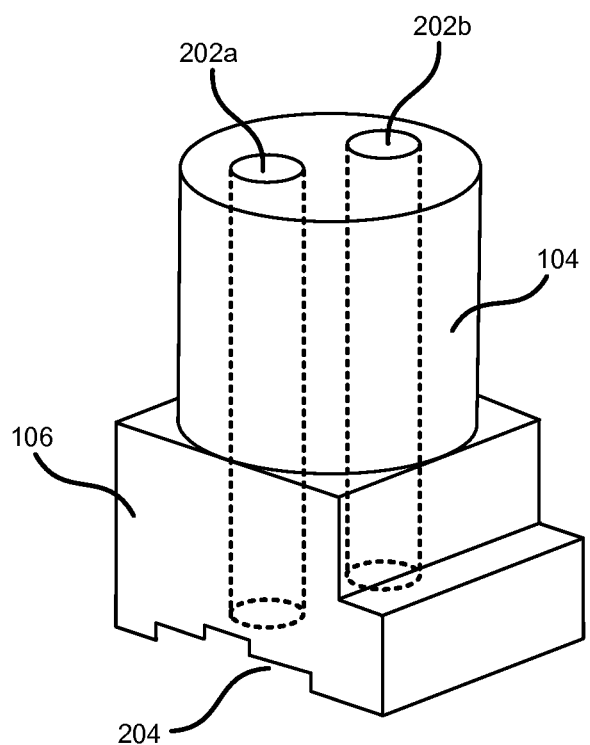
FIG. 2 illustrates a standalone standoff device disclosed in the present application.

FIG. 2 illustrates a standalone standoff device disclosed in the present application. In some embodiments, a lighting portion of LED 102 sits on top of the integration component 104, and wires in lead frames of the LED 102 run through the integration component 104 to reach the base component 106. The integration component 104 has a vertical cylindrical shape or any other shape that accommodates the lead frames of the LED 102. The base component 106 has a square shape or any other shape that supports the standoff device to stay in an upright position, as further discussed below. The standoff device includes two slots 202a and 202b for the two lead frames of the LED 102 that run through the integration component 104 and the base component 106 to reach the PCB. The base component 106 also has a lifted bottom 204 to create solder space for the lead frames, as further discussed below. Typically, the lead frames are inserted into the standoff device and initially secured by being bent at the bottom end 108 around the lifted bottom 204 in the shape of staples, by hand or mechanical means. Any excess of the lead frame can be cut off to achieve an appropriate length.

In some embodiments, the integration component 104 has a customizable height, typically between one-eighth of an inch and half an inch, which can be specified by a user in advance of the manufacturing process. This feature allows the user to achieve a custom amount of elevation for the LED 102 to suit the full design of a control panel. The width of the integration component 104 mainly depends on the number of LEDs to be received, as further discussed below. The number of LEDS to be received is generally not limited except by the manufacturing cost or similar factors.

In some embodiments, the spacing between the slots 202a and 202b for the LED 102 depends on the spacing between the lead frames of the LED 102, with a typical value is one-tenth of an inch. Generally, the standoff device can have more than two slots for a multi-color LED. For example, the standoff device can have three slots for a bi-color LED or four slots for a tri-color LED. In addition, the standoff device can have more than two slots to accommodate multiple LEDs. The spacing between two LEDs typically depends on design requirements. For example, for a T1 ¾ (5mm) LED, the center-to-center spacing of the LEDs is typically at least ¼ inch at a minimum.

In some embodiments, the shapes or sizes of the two slots 202a and 202b for the LED 102 are different to distinguish at least between the cathode and the anode of the LED 102. Such difference avoids polarity errors in assembling the standoff device with the LED 102 and the mounting of the LED 102 to the PCB. It also ensures that parts of the LED 102 are loaded into a tube, reel and tape, tray, or any other type of packaging in the correct orientation, thereby guaranteeing that the parts enter a surface-mount component placement system with a consistent orientation. As one example, one of the two slots 202a and 202b can have one shape in cross section, such as a circle, an oval, a square, or a rectangle, and the other one can have another shape. As another example, one of the two slots 202a and 202b can be bigger than the other. This can be beneficial when the LED 102 has a longer wire for one of the terminals that can use more room as it is being threaded through the slot.

In some embodiments, the overall shape of the base component 106, which can depend on the overall shape of the integration component 104, ensures a low center of mass or gravity and thus the vertical stability of the standoff device, especially during a trip through the reflow oven. Therefore, the width of the base component 106 is typically larger than the width of the integration component 104. The width of the standoff device also tends to increase when the height of the standoff device increases. As the base component 106 consumes space on the PCB, the width of the base component 106 should otherwise be kept to a minimum. In addition, the base component 106 has a lifted bottom 204 around the bottom ends of the two slots 202a and 202, namely at the junction of the lead frames and the PCB, to accommodate solder in the initial paste (solid) state, the melted (liquid) state, and the eventual frozen (solid) state during the reflow soldering process. In particular, as the solder melts, the paste out-gasses and there is a need to allow the matter to escape.

Figure 3:
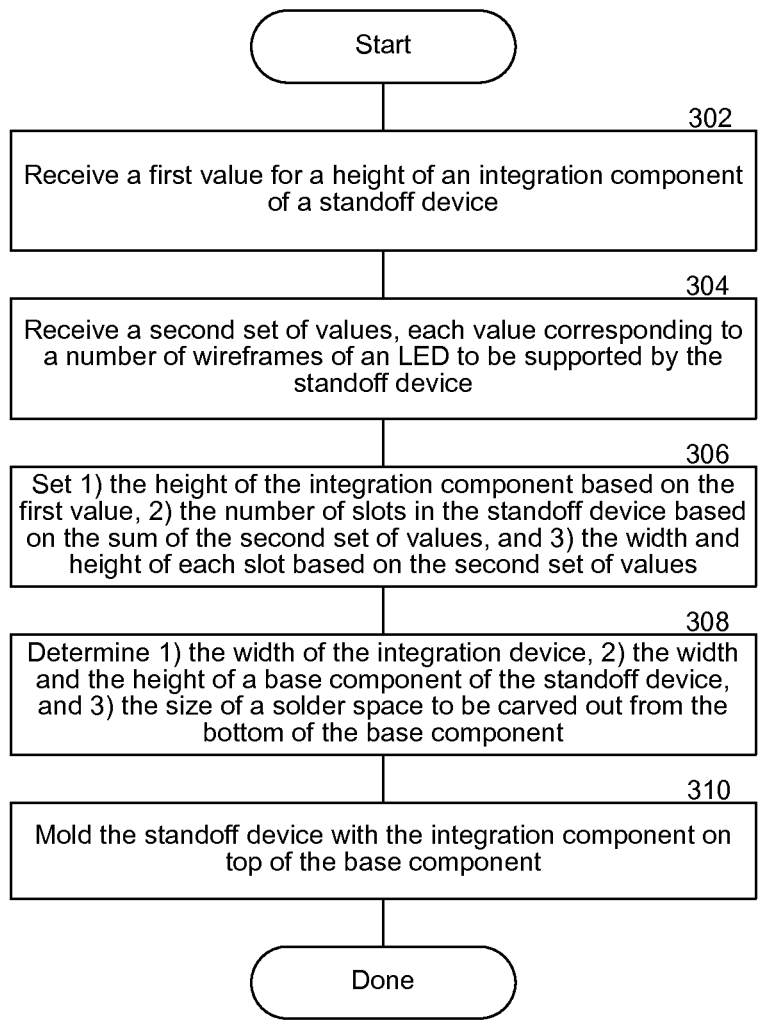
FIG. 3 illustrates a method of manufacturing a standoff device disclosed in the present application.

FIG. 3 illustrates a method of manufacturing a standoff device disclosed in the present application. In step 302, a system receives a specific value for a height of the integration component of the standoff device. In step 304, the system also receives a specific set of values, each value corresponding to a number of wireframes of an LED to be supported by the standoff device. For example, when the standoff device is to support one mono-color LED and one bi-color LED, the specific set of values consists of 2 and 3. In step 306, the system sets the height of the integration component based on the specific value. The system also sets the number of slots in the standoff device based on the specific set of values, and specifically the sum of those values. In addition, the system determines the shape of each slot based on the specific set of values. In step 308, the system determines the rest of the parameters, including 1) the width of the integration device, 2) the width and the height of the base component of the standoff device, and 3) the dimensions of the lifted bottom of the base component, based on the number of slots, the need for vertical stability, or other factors. In step 310, the system then creates the standoff device in a mold, generally using heat-resistant material.

CONCLUSION

In addition to the above mentioned examples, various other modifications and alterations of the invention may be made without departing from the invention. Accordingly, the above disclosure is not to be considered as limiting, and the appended claims are to be interpreted as encompassing the true spirit and the entire scope of the invention.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions.

It is to be understood that the phraseology and terminology employed herein is not to be construed as limiting and are for descriptive purpose only.

It is to be understood that the details set forth herein do not construe a limitation to an application of the invention.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not preclude the addition of one or more components, features, steps, or integers or groups thereof and that the terms are to be construed as specifying components, features, steps or integers.

We claim:

1. A standoff device for surface-mounting light-emitting diodes (LEDs) above a printed circuit board (PCB), comprising:
   an integration component that receives one or more LEDs; and
   a base component that is connected to a bottom of the integration component and in contact with the PCB,
   wherein the standoff device is made of heat-resistant, moldable material,
   wherein the standoff device contains two or more slots for wire frames of the one or more LEDs,
   wherein the slots run through the integration component and the base component,
   wherein the slots associated with the same LED have different shapes or sizes, and
   wherein the base component includes a lifted bottom that allows solder flowing onto the wire frames during a reflow soldering process for surface-mounting the LED to the PCB.

2. The standoff device of claim 1, wherein shapes and sizes of the integration component and the base component ensure vertical stability of the standoff device.

3. The standoff device of claim 1, wherein the integration component has a vertical cylindrical shape, and the base component has a square-like shape.

4. The standoff device of claim 1, wherein the different shapes or sizes of the slots distinguish between different polarities of the wire frames.

5. The standoff device of claim 1, wherein the integration component has a custom, user-specified height.

6. The standoff device of claim 1, wherein the heat-resistant, moldable material includes plastic.

7. The standoff device of claim 1, wherein the base component and the integration component form a single seamless piece.

8. The standoff device of claim 1, wherein spacing between two slots associated with one LED is uniform.

9. A method for manufacturing a standoff device for surface-mounting light-emitting diodes (LEDs) above a printed circuit board (PCB), comprising:
   receiving from a user a specific value; and
   creating a standoff device comprising an integration component and a base component through a molding process,
   wherein the integration component and the base component stack vertically from top to bottom,
   wherein a height of the integration component is based on the specific value,
   wherein the standoff device includes multiple slots running vertically through the integration component and the base component to accommodate wire frames of one or more LEDs,
   wherein the slots accommodating wire frames of the same LED have different shapes or sizes, and
   wherein the base component includes a lifted bottom that is large enough to allow solder flowing onto wire frames of the one or more LEDs for surface mounting purposes.

10. The method of claim 9, further comprising
    receiving from a user a specific set of values, one for each of the one or more LEDs to be supported by the standoff device,
    wherein a number of slots in the standoff device and the shape or size of each of the slots are based on the second value.

11. The method of claim 9, wherein a width of the base component is larger than a width of the integration component.

12. The method of claim 9, wherein the integration component has a vertical cylindrical shape, and the base component has a square-like shape.

13. The method of claim 9, wherein the widths of the integration component and the base component and the size of a space between the lifted bottom and the PCB are based on a number of slots in the standoff device.

14. The method of claim 9, wherein the different shapes or sizes of the slots distinguish between the different polarities of the wire frames.

15. The method of claim 9, wherein the creating includes molding heat-resistant, moldable material into the standoff device.

16. At least one non-transitory computer-readable medium carrying a computer program performing a method of manufacturing a standoff device for surface-mounting light-emitting diodes (LEDs) above a printed circuit board (PCB), the method comprising:
   receiving a specific value;
   receiving a specific set of values, each value corresponding to a number of wireframes of an LED to be supported by the standoff device;
   setting a height of an integration component of the standoff device based on the specific value;
   setting a number of slots in the standoff device and a shape or size of each slot based on the specific set of value;
   determining a width of the integration component, a width and a height of a base component of the standoff device, and a shape or size of a solder space to be carved out from the bottom of the base component based on the number of slots and the height of the integration component; and
   molding the standoff device with the integration component on top of the base component according to the set and determined values.

17. A standoff device for surface-mounting light-emitting diodes (LEDs) above a printed circuit board (PCB), comprising:
   an integration component that has a vertical cylindrical shape and receives one or more LEDs on the top; and
   a base component that has a rectangular shape and is in contact with the PCB on the bottom,
   wherein the standoff device is made of heat-resistant, moldable material,
   wherein the integration component and the base component stack up vertically and form a single seamless piece,
   wherein the integration component has a custom, user-specified height,
   wherein a center of mass of the standoff device is sufficiently low to ensure vertical stability of the standoff device during a reflow soldering process for surface-mounting the LED to the PCB,
   wherein the standoff device contains two or more slots that run through the integration component and the base component and accommodate wire frames of the one or more LEDs,
   wherein the slots associated with the same LED have different shapes or sizes, and
   wherein the base component includes a lifted bottom to accommodate solder during the reflow soldering process.

* * * * *